(12) United States Patent
Shingu et al.

(10) Patent No.: US 8,754,467 B2
(45) Date of Patent: Jun. 17, 2014

(54) SEMICONDUCTOR DEVICE, AND METHOD FOR MANUFACTURING SEMICONDUCTOR DEVICE

(71) Applicant: Kabushiki Kaisha Toshiba, Minato-ku (JP)

(72) Inventors: Masao Shingu, Kawasaki (JP); Akira Takashima, Fuchu (JP); Koichi Muraoka, Sagamihara (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/944,989

(22) Filed: Jul. 18, 2013

(65) Prior Publication Data

US 2014/0021528 A1    Jan. 23, 2014

Related U.S. Application Data

(63) Continuation of application No. 13/208,454, filed on Aug. 12, 2011, now Pat. No. 8,558,301, which is a continuation of application No. PCT/JP2010/000675, filed on Feb. 4, 2010.

(30) Foreign Application Priority Data

Feb. 17, 2009    (JP) .................. 2009-033840

(51) Int. Cl.
*H01L 29/792*    (2006.01)
(52) U.S. Cl.
USPC .................... 257/324; 257/411; 257/E29.304
(58) Field of Classification Search
USPC .............................................. 257/325, 326
See application file for complete search history.

(56) References Cited

U.S. PATENT DOCUMENTS 7,646,056 B2 *    1/2010    Choi et al. ............... 257/325
7,655,971 B2 *    2/2010    Ino et al. ................. 257/325

(Continued)

FOREIGN PATENT DOCUMENTS

| CN | 1825628 A | 8/2006 |
|---|---|---|
| JP | 7-130729 | 5/1995 |

(Continued)

OTHER PUBLICATIONS

International Search Report issued on Apr. 27, 2010 for PCT/JP10-000675 filed on Feb. 4, 2010 with English translation of categories.

(Continued)

*Primary Examiner* — Chandra Chaudhari
(74) *Attorney, Agent, or Firm* — Oblon, Spivak, McClelland, Maier & Neustadt, L.L.P.

(57) ABSTRACT

A semiconductor device includes: a semiconductor region; a plurality of stacked structures each of which is disposed on the semiconductor region and has a tunnel insulating film, a charge storage layer, an upper insulating layer, and a control electrode stacked sequentially; an element isolation insulating layer disposed on side faces of the plurality of stacked structures; and a source-drain region disposed on the semiconductor region and among the plurality of stacked structures. The element isolation insulating layer includes at least one of $SiO_2$, SiN, and SiON, the upper insulating layer is an oxide containing at least one metal M selected from the group consisting of a rare earth metal, Y, Zr, and Hf, and Si, and respective lengths $L_{charge}$, $L_{top}$, and $L_{gate}$ of the charge storage layer, the upper insulating layer, and the control electrode in a channel length direction satisfy the relation "$L_{charge} < L_{top}$ and $L_{gate} < L_{top}$".

4 Claims, 4 Drawing Sheets

(56) References Cited

U.S. PATENT DOCUMENTS

| | | |
|---|---|---|
| 7,821,059 B2 | 10/2010 | Shingu et al. |
| 2006/0157754 A1 | 7/2006 | Jeon et al. |
| 2007/0042612 A1 | 2/2007 | Nishino et al. |
| 2008/0173927 A1 | 7/2008 | Sakuma et al. |

FOREIGN PATENT DOCUMENTS

| | | |
|---|---|---|
| JP | 2006-203200 | 8/2006 |
| JP | 2007-088422 | 4/2007 |
| JP | 2008-177492 | 7/2008 |
| JP | 2008-193107 | 8/2008 |
| KR | 2006-0083583 | 7/2006 |
| KR | 2008-0069130 A | 7/2008 |

OTHER PUBLICATIONS

International Written Opinion issued on Apr. 27, 2010 for PCT/JP10-000675 filed on Feb. 4, 2010.

Changseok Kang, et al.; "Effects of Lateral Charge Spreading on the Reliability of TANOS (TaN/AlO/SiN/Oxide/Si) NAND Flash Memory"; IEEE 2007 45th Annual International Reliability Physics Symposium; pp. 167-169.

Office Action mailed Apr. 23, 2013 in Japanese Application No. 2009-033840 filed Feb. 17, 2009 (w/English translation).

Mazza et al. (Study on the Al2O3-SiO2-La2O3 Ternary System at 1300° C., Materials Research Bulletin, vol. 34, No. 9, 1999, pp. 1375-1382).

\* cited by examiner

| METAL M | MO | NUMBER M OF ATOMS IN MO UNIT LATTICE | NaI / NM LOWER LIMIT | NaI / NM UPPER LIMIT |
|---|---|---|---|---|
| Y | $Y_2O_3$ (CUBIC SYSTEM) | 32 | 1/32 | 96 |
| Pr | $Pr_2O_3$ | – | – | 96 |
| Zr | $ZrO_2$ (MONOCLINIC SYSTEM) | 4 | 1/4 | 96 |
| Nd | $Nd_2O_3$ (HEXAGONAL SYSTEM) | 2 | 1/2 | 96 |
| Sm | $Sm_2O_3$ (MONOCLINIC SYSTEM) | 12 | 1/12 | 96 |
| Gd | $Gd_2O_3$ (HEXAGONAL SYSTEM) | 2 | 1/2 | 96 |
| Hf | $HfO_2$ (MONOCLINIC SYSTEM) | 4 | 1/4 | 96 |

SEMICONDUCTOR DEVICE, AND METHOD FOR MANUFACTURING SEMICONDUCTOR DEVICE

CROSS-REFERENCE TO RELATED APPLICATION

This application is a continuation of and claims the benefit of priority under 35 U.S.C. §120 from U.S. Ser. No. 13/208,454 filed Aug. 12, 2011, which is a continuation of International Application No. PCT/JP2010/000675 filed Feb. 4, 2010, and claims the benefit of priority under 35 U.S.C. §119 from Japanese Patent Application No. 2009-033840 filed Feb. 17, 2009; the entire contents of each of which are incorporated herein by reference.

FIELD

Embodiments described herein relate generally to provide a semiconductor device in which degradation of reliability originating in the interface between an upper insulating layer and an element isolation insulating layer is suppressed.

BACKGROUND

A non-volatile semiconductor memory device represented by EEPROM has a structure in which a tunnel insulating film, a charge storage layer, an upper insulating layer, and a control electrode are stacked on a semiconductor substrate. Information is written by applying a high voltage to the control electrode and implanting electrons into the charge storage layer from the semiconductor substrate via the tunnel insulating film.

In addition, a structure using a conductive charge storage layer represented by a polycrystalline silicon for the aforementioned charge storage layer is generally called a floating gate type. Further, a structure using an insulating charge storage layer represented by a silicon nitride film is generally called a floating trap type.

An element isolation insulating layer whose main constituent is $SiO_2$ is formed on side faces of the stacked structure formed of a tunnel insulating film, a charge storage layer, an upper insulating layer, and a control electrode. Surrounding the charge storage layer with the element isolation insulating layer suppresses discharge of charge from the charge storage layer.

When a defect exists in an interface between the upper insulating layer and the element isolation insulating layer, this defect degrades reliability of the semiconductor memory device, which is regarded as a problem. Causes of this problem include damage due to a reactive ion etching process or an ion implanting process, and dangling bond formation due to a difference in film type between the upper insulating layer and the element isolation insulating layer.

As a measure for damage during the reactive ion etching process and the ion implanting process, a structure in which a spacer is formed on a side face of a control electrode of a floating trap type memory is proposed.

However, in the aforementioned structure, voltage is not applied to a lower part of the spacer, and there occurs an area where charges are not implanted in an end portion of the charge storage layer. Accordingly, there is a concern that diffusion of stored charges to an end portion of the charge storage layer during retention causes variation in threshold of the semiconductor memory device.

DETAILED DESCRIPTION

Figures 1, 2:
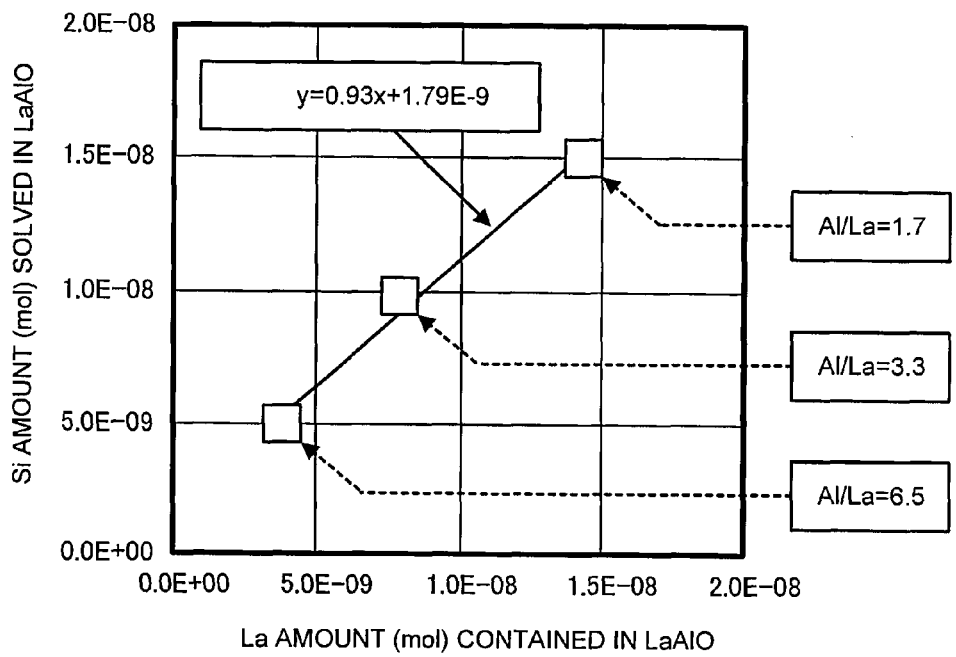
FIG. 1 is a diagram illustrating the numbers of M elements in a unit lattice of oxides and lower limit values and upper limit values of Al/M number ratio for M=Y, Pr, Zr, Nd, Sm, Gd, and Hf.
FIG. 2 is a graph illustrating the relation between a Si amount and a La amount solved in LaAlSiO.

In an embodiment, a semiconductor device includes: a semiconductor region; a plurality of stacked structures each of which is disposed on the semiconductor region and has a tunnel insulating film, a charge storage layer, an upper insulating layer, and a control electrode stacked sequentially; an element isolation insulating layer disposed on side faces of the plurality of stacked structures; and a source-drain region disposed on the semiconductor region and among the plurality of stacked structures, in which the element isolation insulating layer includes at least one of $SiO_2$, SiN, and SiON, in which the upper insulating layer is an oxide containing at least one metal M selected from the group consisting of a rare earth metal, Y, Zr, and Hf, and Si, and in which respective lengths $L_{charge}$, $L_{top}$, and $L_{gate}$ of the charge storage layer, the upper insulating layer, and the control electrode in a channel length direction satisfy the relation "$L_{charge} < L_{top}$ and $L_{gate} < L_{top}$".

In an embodiment, a method for manufacturing a semiconductor device includes: forming a tunnel insulating film and a charge storage layer sequentially on a semiconductor region; forming a reactive insulating layer containing at least one metal M selected from the group consisting of a rare earth metal, Y, Zr, and Hf on the charge storage layer; forming a control electrode on the reactive insulating layer; etching the tunnel insulating film, the charge storage layer, the reactive insulating layer, and the control electrode in a stacking direction to expose a surface of the semiconductor region, so as to form a plurality of stacked structures including the tunnel insulating film, the charge storage layer, the reactive insulating layer, and the control electrode; forming an element isolation insulating layer including at least one of $SiO_2$, SiN, and SiON so as to cover side faces of the plurality of stacked structures; performing heat treatment to cause diffusion and mixing of the reactive insulating layer and a part of the element isolation insulating layer, so as to form an upper insulating layer containing a metal M and Si in which a length $L_{top}$ in a channel length direction satisfies the relation "$L_{charge} < L_{top}$ and $L_{gate} < L_{top}$" with lengths $L_{charge}$ and $L_{gate}$ of the charge storage layer and the control electrode in the channel length direction; implanting ions into the semiconductor region with the stacked structures being a mask, and performing heating for activation, so as to form a source-drain region on the semiconductor region and among the plurality of stacked structures.

In an embodiment, it is possible to provide a semiconductor device in which degradation of reliability originating in the interface between an upper insulating layer and an element isolation insulating layer is suppressed.

Hereinafter, embodiments of the present invention will be described in detail with reference to the drawings.

In an embodiment, a semiconductor device includes a semiconductor substrate, a stacked structure, an element isolation insulating layer, and an impurity doping layer. The stacked structure is formed by sequentially stacking a tunnel insulating film, a charge storage layer, an upper insulating layer, and a control electrode on the semiconductor substrate. The element isolation insulating layer is formed covering side faces of the stacked structure. The impurity doping layer is formed on both sides of the tunnel insulating film of the semiconductor substrate.

It is preferred that lengths $L_{charge}$, $L_{top}$, $L_{gate}$ in a channel length direction of the charge storage layer, the upper insulating layer, and the control electrode satisfy the following first requirement.

$$L_{charge} < L_{top} < 2 \times L_{charge} \text{ and } L_{gate} < L_{top} < 2 \times L_{gate}$$

Further, in the semiconductor device, it is preferred that the upper insulating layer be a composite oxide containing at least one metal M selected from the group consisting of a rare earth metal, Y, Zr, and Hf, and Si (second requirement). This is because a semiconductor device satisfying the first requirement is easily obtained by allowing reaction of the oxide containing the metal M with $SiO_2$ by heat treatment. These requirements will be described below.

<About First Requirement>

In a semiconductor device, it is preferred that the lengths $L_{charge}$, $L_{top}$, and $L_{gate}$ of the charge storage layer, the upper insulating layer, and the control electrode in a channel length direction satisfy "$L_{charge} < L_{top} < 2 \times L_{charge}$ and $L_{gate} < L_{top} < 2 \times L_{gate}$". In particular, it is preferred that "$L_{charge}$ and $L_{gate} < L_{top}$" hold true, that is, the length $L_{top}$ of the upper insulating layer be larger than both the lengths $L_{charge}$ and $L_{gate}$ of the charge storage layer and the control electrode. Existence of the upper insulating layer protruding between the charge storage layer and the control electrode suppresses application of voltage to the interface between the upper insulating layer and the element isolation insulating layer, and improves reliability of the semiconductor device.

"$L_{top} < 2 \times L_{charge} < 2 \times L_{gate}$" is a requirement for preventing overlap of stacked structures when there exist a plurality of stacked structures. That is, generally, when the semiconductor device is of NAND type, an interval between elements which are adjacent in a channel direction matches the length of the charge storage layer. Accordingly, to prevent overlap among the plurality of stacked structures, it is preferred that the length of the upper insulating layer be less than double the charge storage layer.

In addition, by making the control electrode and the charge storage layer with about the same lengths, a threshold change in the semiconductor device hardly occurs. When implanted charges in the charge storage layer are not uniform, the implanted charges move in the charge storage layer, and it is possible that an operating threshold in the semiconductor device changes. By making the control electrode and the charge storage layer with about the same lengths, charges can be implanted uniformly into the charge storage layer, thereby preventing the threshold variation due to non-uniformity of charges in the charge storage layer.

<About Second Requirement>

The structure described by the first requirement can be formed by processing the charge storage layer, a reactive insulating layer, and the control electrode to have the same length, and thereafter causing reaction between the reactive insulating layer (in which the concentration of $SiO_2$ is less than a solubility limit) and the element isolation insulating layer, thereby forming the upper insulating layer. The element isolation insulating layer is mainly formed of $SiO_2$, and thus it is preferred that the upper insulating layer be an oxide containing Si. Further, when the $SiO_2$ in the element isolation insulating layer reacts with a component material of the upper insulating layer, permittivity of the upper insulating layer decreases, and this may degrade characteristics of the semiconductor device. To maintain the permittivity of the upper insulating layer, it is preferred that the metal M be selected from the group consisting of a rare earth metal, Y, Zr, and Hf whose permittivity of oxide is high.

(Number Ratio Between Metal M and Si in the Upper Insulating Layer)

Further, it is preferred that a ratio (number ratio) $N_{Si}/N_M$ of the number $N_{Si}$ of Si to the number $N_M$ of metal M in the upper insulating layer satisfy both the following requirements.

The number ratio $N_{Si}/N_M$ is equal to or higher than a ratio at the $SiO_2$ solubility limit in an oxide of the metal M.

The number ratio $N_{Si}/N_M$ is equal to or lower than a ratio with which the permittivity of the upper insulating layer matches that of $Al_2O_3$.

Hereinafter, reasons for the preference of the number ratio $N_{Si}/N_M$ to satisfy the above-described requirements will be described.

In semiconductor manufacturing processes, heating for the purpose of activating impurities and the like is added after forming the upper insulating layer. It is desired to suppress reaction between the upper insulating layer and the element isolation insulating layer caused by the heating after forming the upper insulating layer. By making the number ratio $N_{Si}/N_M$ in the upper insulating layer to be equal to or higher than the solubility limit at a heating temperature after forming the upper insulating layer (temperature during impurity activation heating which will be described later), the reaction can be suppressed.

That is, when the upper insulating layer already contains $SiO_2$ at a ratio equal to or higher than the solubility limit, $SiO_2$ in the element isolation insulating layer is prevented from entering the upper insulating layer during the impurity activation heating after forming the upper insulating layer. Therefore, reaction between the upper insulating layer and the element isolation insulating layer can be suppressed.

On the other hand, when the amount of Si in the upper insulating layer increases, the permittivity of the upper insulating layer decreases, and this degrades performance as an insulating film. Accordingly, it is necessary to set the number ratio $N_{Si}/N_M$ in the upper insulating layer equal to or lower than a predetermined ratio, so as to secure characteristics of the upper insulating layer as a high-permittivity insulating film.

Thus, with the permittivity of $Al_2O_3$ which is a general-purpose high-permittivity insulating film being a benchmark (reference), the upper insulating layer is made to have a permittivity equal to or higher than this permittivity. Let us consider that the upper insulating layer is represented by a composition MSiO. It is assumed that the relative permittivity of an oxide MO of the metal M is $\epsilon_k$, and the ratio (number ratio) between the number $N_M$ of M and the number $N_{Si}$ of Si is $N_{Si}/N_M$. The relative permittivity of $SiO_2$ is 3.9. At this time, the relative permittivity $\epsilon_r$ of the upper insulating layer (composition MSiO) is represented by the following expression.

$$\epsilon_r = (N_M \times \epsilon_k + N_{Si} \times 3.9)/(N_M + N_{Si})$$

Accordingly, to make the permittivity of the upper insulating layer be equal to or higher than that of $Al_2O_3$, the following expression may be satisfied.

$$10 \leq (N_M \times \epsilon_k + N_{Si} \times 3.9)/(N_M + N_{Si})$$

By transforming this expression the following expression is obtained. Thus, the upper limit of the number ratio $N_{Si}/N_M$ is defined.

$$N_{Si}/N_M \leq (\epsilon_k - 10)/6.1$$

Thus, the lower limit of the $N_{Si}/N_M$ is given by the solubility limit of $SiO_2$ in the oxide MO of the metal M, and the upper limit is given by the permittivity which matches that of the $Al_2O_3$. Therefore, when the number ratio $N_{Si}/N_M$ at the solubility limit of $SiO_2$ is x, the number ratio $N_{Si}/N_M$ satisfying the above condition can be represented by $x \leq N_{Si}/N_M \leq (\epsilon_k - 10)/6.1$ in the upper insulating layer.

Further, in order for a Si/M composition satisfying the above expression to exist, it is necessary that x and $\epsilon_k$ satisfy the relation $x \leq (\epsilon_k - 10)/6.1$. The at least one metal M selected from the group consisting of a rare earth metal, Y, Zr, and Hf forming the upper insulating layer satisfies the above-described requirements.

For example, when the metal M is La, by substituting the relative permittivity $\epsilon_k = 27$ of $La_2O_3$ and the number ratio $x=1$ of Si/La at the $SiO_2$ solubility limit into the above expression, the number ratio $N_{Si}/N_{La}$ satisfying the above-described requirements becomes "$1 \leq N_{Si}/N_{La} \leq 2.78$".

When the metal M is Zr, by substituting the relative permittivity $\epsilon_k = 25$ of $ZrO_2$ and the number ratio $x=1$ of Si/Zr at the $SiO_2$ solubility limit into the above expression, the number ratio $N_{Si}/N_{Zr}$ satisfying the above-described requirements becomes $1 \leq N_{Si}/N_{Zr} \leq 2.459$. When the metal M is Hf, by substituting the relative permittivity $\epsilon_k$ of $HfO_2 = 25$ and the number ratio $x=1$ of Si/Hf at the $SiO_2$ solubility limit into the above expression, the number ratio $N_{Si}/N_{Hf}$ satisfying the above-described requirements becomes $1 \leq N_{Si}/N_{Hf} \leq 2.459$.

(Appropriate Relation Between the Charge Storage Layer and the Length in a Channel Length Direction of the Upper Insulating Layer)

As described above, an upper limit exists in the Si ratio to the metal M in the upper insulating layer. The upper insulating layer is formed by mixing the reactive insulating layer and the element isolation insulating layer formed of $SiO_2$, and thus the following upper limit exists for the length of the upper insulating layer.

The following relation holds true between the length $L_{top}$ of the upper insulating layer and the length $L_{react}$ of the reactive insulating layer.

$$L_{top} = L_{react} \times (1 + N_{Si}/N_M \times V_{Si}/V_M)$$

Here, $V_M$ is the volume occupied by 1 mole of MOz when a composition formula for the reactive insulating layer is MOz, $V_{Si}$ is the volume occupied by one mole of $SiO_2$, and $N_{Si}/N_M$ is the number ratio of Si to the metal M in the upper insulating layer.

The upper limit of the number ratio $N_{Si}/N_M$ is $(\epsilon_k - 10)/6.1$, and thus an upper limit $(L_{react} \times (1 + (\epsilon_k - 10)/6.1 \times V_{Si}/V_M))$ exists for the length $L_{top}$.

Further, it is assumed that the reactive insulating layer is processed similarly to the charge storage layer and the upper insulating layer. In this case, the relation of the lengths $L_{charge}$, $L_{top}$, and $L_{gate}$ can be represented as follows.

$$L_{charge} < L_{top} < L_{charge} \times (1 + (\epsilon_k - 10)/6.1 \times V_{Si}/V_M),$$

$$L_{gate} < L_{top} < L_{gate} \times (1 + (\epsilon_k - 10)/6.1 \times V_{Si}/V_M)$$

In addition, when the upper insulating layer is formed of a composite oxide formed of the metal M and Al, a similar relation holds true by using a volume $V_{MAl}$ instead of $V_M$ when the composition formula is MAlyOz.

(Number Ratio Al/M in the Upper Insulating Layer Containing Metal M, Al and Si)

Next, effects and an appropriate range of composition when the upper insulating layer of the semiconductor device contains Al will be described. If the upper insulating layer crystallizes before reacting with the element isolation insulating layer, reaction between the upper insulating layer and the element isolation insulating layer becomes non-uniform, resulting in degradation of characteristics of the semiconductor device and increase in dispersion of characteristics. By adding Al to the oxide of the metal M, suppression of crystallization of the oxide MO is expected. On the other hand, an excessive amount of Al causes crystallization of $Al_2O_3$. Accordingly, the number ratio of Al to metal M is in the range allowing suppression of crystallization of both the oxide of the metal M and $Al_2O_3$.

Specifically, as a heterogeneous atom, Al operates on the oxide of the metal M and the metal M operates on $Al_2O_3$, thereby suppressing crystal growth.

A crystal is a repeating pattern of unit lattice, and thus a heterogeneous atom contained in the composition of crystal has effects to hinder repetition of the unit structure and suppress crystal growth. Therefore, as a heterogeneous atom, Al operates on the oxide of the metal M and the metal M operates on $Al_2O_3$, thereby suppressing crystallization. To effectively suppress crystallization, it is preferred that one or more atoms exist with respect to eight unit lattices as a ratio of heterogeneous atoms. Under such a condition, one or more heterogeneous atoms exist on the average in adjacent unit lattices, and translational symmetry cannot be obtained. Thus, crystal growth can be suppressed effectively.

An example of the case where the metal M is La will be described specifically below.

An Al atom corresponds to the heterogeneous atom with respect to $La_2O_3$. Since two La atoms are contained in a unit lattice of $La_2O_3$, 16 La atoms exist in eight unit lattices. Therefore, in order for one or more Al atoms to exist on the average in adjacent unit lattices, it is necessary that a number ratio $N_{Al}/N_{La}$ satisfies $1/16 \leq N_{Al}/N_{La}$. Thus, crystallization of $La_2O_3$ can be suppressed.

On the other hand, a La atom corresponds to a heterogeneous atom with respect to $Al_2O_3$. Since 12 Al atoms are contained in a unit lattice of $\alpha$-$Al_2O_3$, 96 Al atoms exist in eight unit lattices. Therefore, in order for one or more La atoms to exist on the average in adjacent unit lattices, a number ratio $N_{La}/N_{Al}$ may satisfy $1/96 \leq N_{La}/N_{Al}$. That is, when $N_{Al}/N_{La} \leq 96$, the above requirements can be satisfied, and crystallization of $Al_2O_3$ can be suppressed.

From the above, in view of crystallization suppression for $La_2O_3$ and $Al_2O_3$, it is desired that the ratio of Al to La satisfies the relation of $0.0625 \leq N_{Al}/N_{La} \leq 96$.

In addition, the numbers of M elements in a unit lattice of oxides and lower limit values and upper limit values of the Al/M number ratio with M=Y, Pr, Zr, Nd, Sm, Gd, and Hf are illustrated in FIG. 1.

(The Si Solubility Limit in MAlO)

The solubility limit of Si when the upper insulating layer contains Al will be described below. Using La as the metal M, the amount of Si solved in LaAlO is quantized. A SiO2 film is deposited on a LaAlO film in which the number ratio $N_{Al}/N_{La}$ of Al/La is changed, and heat treatment is performed for 30 seconds at 900° C. in an $N_2$ atmosphere, thereby forming LaAlSiO. The amount of La and the amount of Si contained in the formed LaAlSiO is illustrated in FIG. 2.

As illustrated in FIG. 2, it can be seen that the relation of $N_{Si}/N_{La}$ to 1 is satisfied regardless of the number ratio $N_{Al}/N_{La}$. On the other hand, the solubility limit of $SiO_2$ in $La_2O_3$ satisfies $N_{Si}/N_{La}=1$, and hence it can be seen that the solubility limit of $SiO_2$ in LaAlO substantially matches the solubility limit in $La_2O_3$. Therefore, when the relation $1 \leq N_{Si}/N_{La}$ is satisfied, the LaAlSiO contains $SiO_2$ at a ratio equal to or more than the solubility limit during the heating at 900° C. or lower. It is conceivable that a similar relation holds true when a different element is used for the metal M.

In addition, it is possible to make $SiO_2$ in LaAlSiO to be equal to or higher than the solubility limit from the gradient of an approximation line illustrated in FIG. 2, strictly by satisfying the relation $0.93 \leq N_{Si}/N_{La}$.

(The LaAlSiO Upper Insulating Layer)

Next, the case where the upper insulating layer in the above-described semiconductor device has the composition LaAlSiO will be described in detail.

In the case where the upper insulating layer and the gate insulating film are formed of an oxide having the composition LaAlSiO, when $N_{La}:N_{Al}:N_{Si}=1:1:1$ is satisfied, a crystal phase $LaAlSiO_5$ comes to exist. When such a crystal phase exists, a leak characteristic in the upper insulating layer is degraded. Accordingly, it is preferred to suppress growth of this crystal phase.

Whether the above-described crystal phase is generated or not is decided by composition ratios of La, Al, and Si in the oxide of LaAlSiO composition, and particularly decided by the composition ratio of Si to La and Al. Therefore, when the oxide of LaAlSiO composition is used for the upper insulating layer, it is necessary to define the range of number ratio $N_{Si}/(N_{La}+N_{Al})$ so as to prevent generation of the crystal phase.

Figure 3:
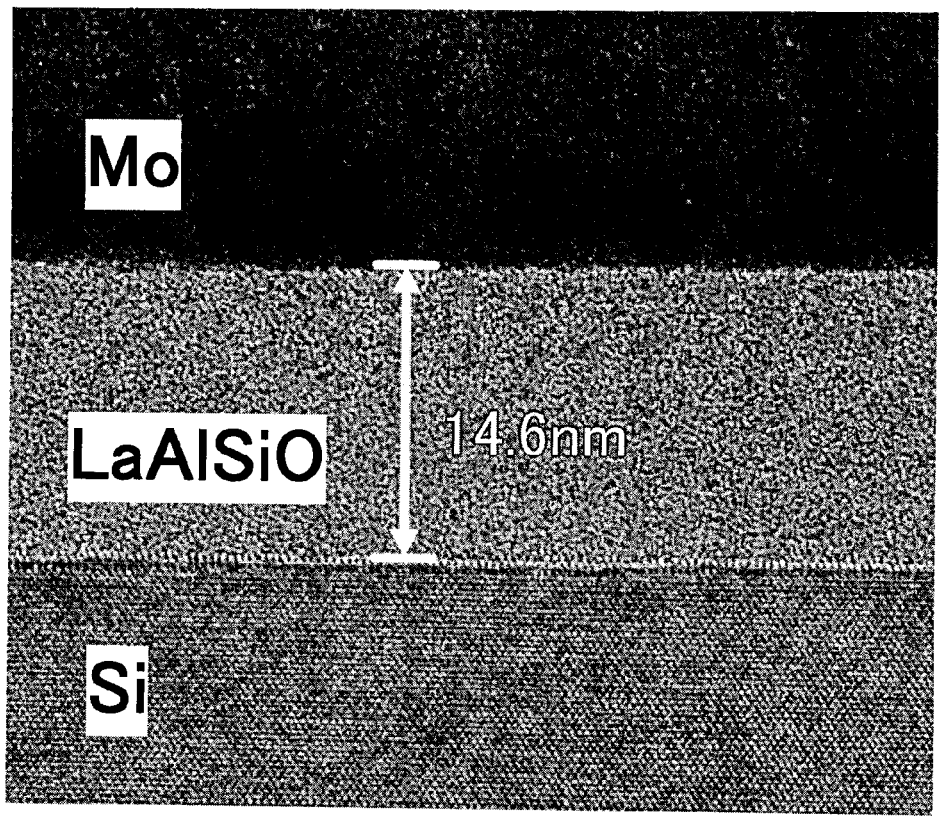
FIG. 3 is a cross-sectional TEM image of a LaAlSiO.

FIG. 3 illustrates a cross-sectional TEM image of LaAlSiO satisfying a number ratio $N_{La}:N_{Al}:N_{Si}=1:1:1.2$. The obtained LaAlSiO film is amorphous even after heat treatment at 900° C. for 30 seconds, and hence it can be seen that generation of the $LaAlSiO_5$ crystal phase is suppressed.

Therefore, when the requirement of the number ratio of $N_{La}:N_{Al}:N_{Si}=1:1:1.2$ is satisfied, assuming that an amorphous film which does not contain the $LaAlSiO_5$ crystal phase is formed, $N_{Si}=1.2$ or more is needed with respect to $N_{La}=1$ and $N_{Al}=1$, and thus "$N_{Si}/(N_{La}+N_{Al}) \geq 0.6$" is required.

Further, with the permittivity of $Al_2O_3$ which is a general-purpose high-permittivity insulating film being a benchmark (reference), the oxide LaAlSiO is made to have a permittivity equal to or higher than this permittivity. The relative permittivity of the oxide LaAlSiO is given by "$(N_{La} \times 27 + N_{Al} \times 10 + N_{Si} \times 3.9)/(N_{La}+N_{Al}+N_{Si})$". Thus, in order for the permittivity of the oxide LaAlSiO to be equal to or higher than the permittivity of $Al_2O_3$, it is necessary to satisfy the relation "$(N_{La} \times 27 + N_{Al} \times 10 + N_{Si} \times 3.9)/(N_{La}+N_{Al}+N_{Si}) \geq 10$". Therefore, "$N_{Si}/N_{La} \leq 2.78$" is required.

In addition, the relative permittivity of the oxide LaAlSiO illustrated in FIG. 3 is 12.4, which satisfies the above-described requirements. However, as long as it satisfies the amorphousness of the above-described LaAlSiO, the relative permittivity of the oxide LaAlSiO is preferred to be as high as possible. Specifically, it is preferred to be close to 27 as much as possible, which is the relative permittivity of $La_2O_3$. However, it is necessary to contain Si to satisfy the amorphousness of the oxide LaAlSiO, and thus the relative permittivity thereof is less than 27.

(Specific Example of the Semiconductor Device)

Figure 4:
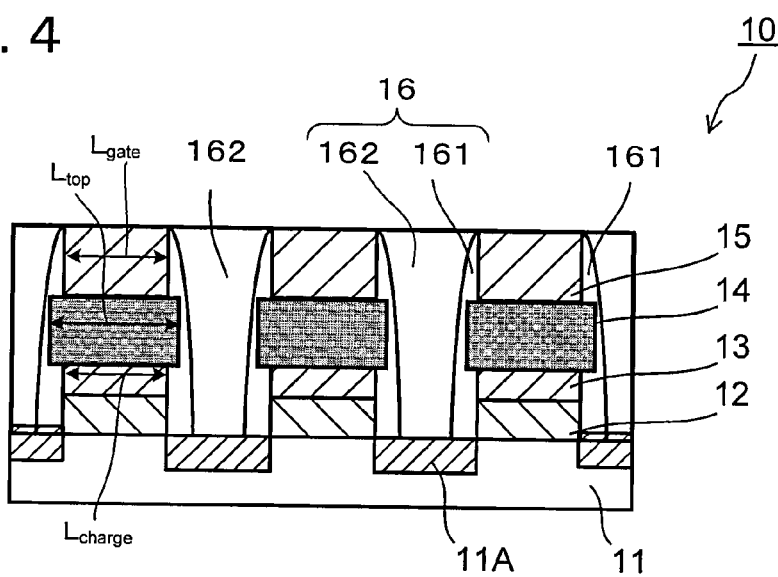
FIG. 4 is a cross-sectional view illustrating a NAND type flash memory as an example of a semiconductor device.

FIG. 4 is a cross-sectional view illustrating a NAND type flash memory 10 as an example of the semiconductor device. Note that FIG. 4 illustrates a cross-section in the channel length direction of the flash memory 10.

As illustrated in FIG. 4, in the flash memory 10 in this example, a tunnel insulating film 12, a charge storage layer 13, an upper insulating layer 14, and a control electrode 15 are stacked sequentially on a silicon substrate 11. Further, an element isolation insulating layer 16 is formed to cover side faces of each of a plurality of stacked structures formed of these stacked layers. Moreover, an impurity doping layer 11A is formed on the silicon substrate 11 and among the plurality of stacked structures.

For the tunnel insulating film 12, for example, a $SiO_2$ film with a thickness of 2 nm to 9 nm formed by thermally oxidizing the silicon substrate 11 can be used. Further, for the charge storage layer 13, for example, a SiN film with a thickness of 1 nm to 10 nm formed by a publicly known method such as CVD (chemical vapor deposition) can be used. Moreover, the control electrode 15 can be formed of a conductive film such as a polycrystalline silicon film, a titanium nitride, or a tantalum nitride. Further, the element isolation insulating layer 16 can be formed of $SiO_2$.

The upper insulating layer 14 is the above-described upper insulating layer and can be formed of a composite oxide containing at least one metal M selected from the group consisting of a rare earth metal, Y, Zr, and Hf, and Si satisfying the above-described requirements.

In addition, the charge storage layer 13 may be a charge storage layer of dot matrix type such as one with a matrix layer containing a microcrystal. The microcrystal can be formed of a material selected from Si, Ti, Hf, Ge and an oxide, a nitride, and an oxynitride thereof. Moreover, it is possible to form a floating gate type memory by using, for example, a polycrystalline silicon film as the charge storage layer 13 and making a floating gate.

Next, a method for manufacturing the NAND type flash memory 10 illustrated in FIG. 4 will be described. FIG. 5 to FIG. 9 are process diagrams of the method for manufacturing the NAND type flash memory 10.

(1) Forming Stacked Structures

Figure 5:
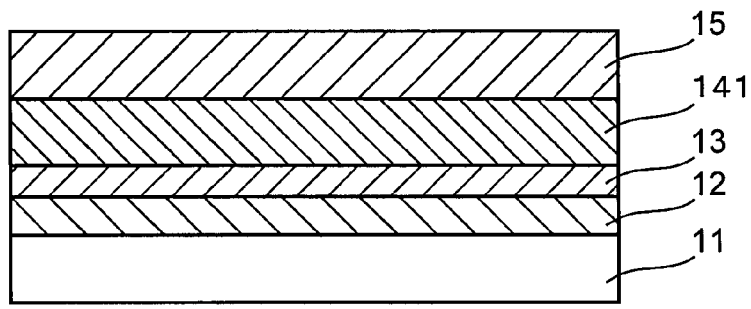
FIG. 5 is a process view in a method for manufacturing the NAND type flash memory illustrated in FIG. 4.

First, as illustrated in FIG. 5, the tunnel insulating film 12, the charge storage layer 13, a reactive insulating layer 141, and the control electrode 15 are formed sequentially on the silicon substrate 11. As described above, the tunnel insulating film 12 can be formed by thermally oxidizing the silicon substrate 11. The charge storage layer 13 can be formed using a publicly known film deposition technique such as CVD (chemical vapor deposition). For the reactive insulating layer 141, an oxide containing at least one metal M selected from the group consisting of a rare earth metal, Y, Zr, and Hf can be used. The reactive insulating layer 141 can be formed using a publicly known film deposition technique such as ALD (atomic layer deposition), CVD (chemical vapor deposition), thermal deposition, electron beam deposition, or sputtering.

Figure 6:
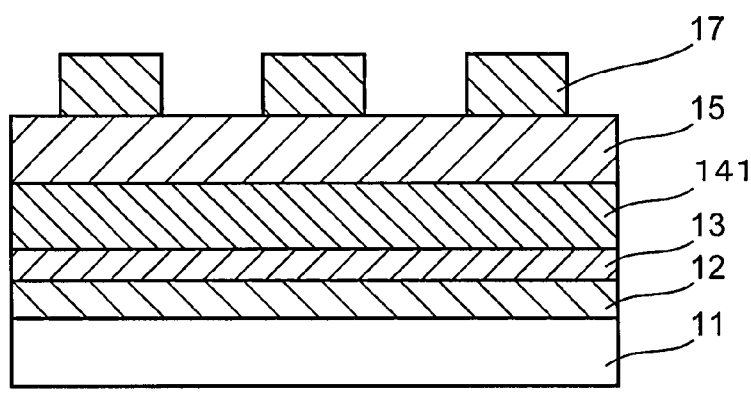
FIG. 6 is likewise a process view in the method for manufacturing the NAND type flash memory illustrated in FIG. 4.
Figure 7:
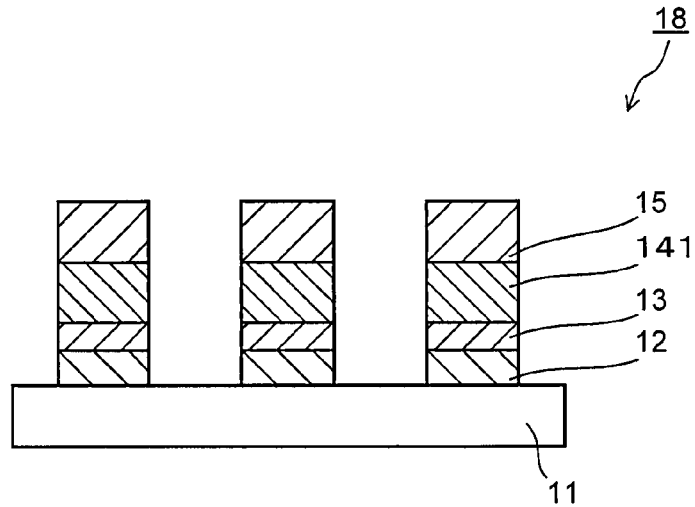
FIG. 7 is likewise a process view in the method for manufacturing the NAND type flash memory illustrated in FIG. 4.

Next, as illustrated in FIG. 6, a photoresist pattern 17 is formed on the control electrode 15. Then, as illustrated in FIG. 7, with the photoresist pattern 17 being a mask, the control electrode 15, the reactive insulating layer 141, the charge storage layer 13, and the tunnel insulating film 12 are etched and separated sequentially by reactive ion etching or the like. As a result, stacked structures 18 are formed in which the tunnel insulating film 12, the charge storage layer 13, the reactive insulating layer 141, and the control electrode 15 are stacked sequentially. At this time, reflecting the result of the etching, respective lengths $L_{charge}$, $L_{react}$, and $L_{gate}$ of the charge storage layer 13, the reactive insulating layer 141, and the control electrode 15 are substantially equal.

(2) Forming Side Walls

Figure 8:
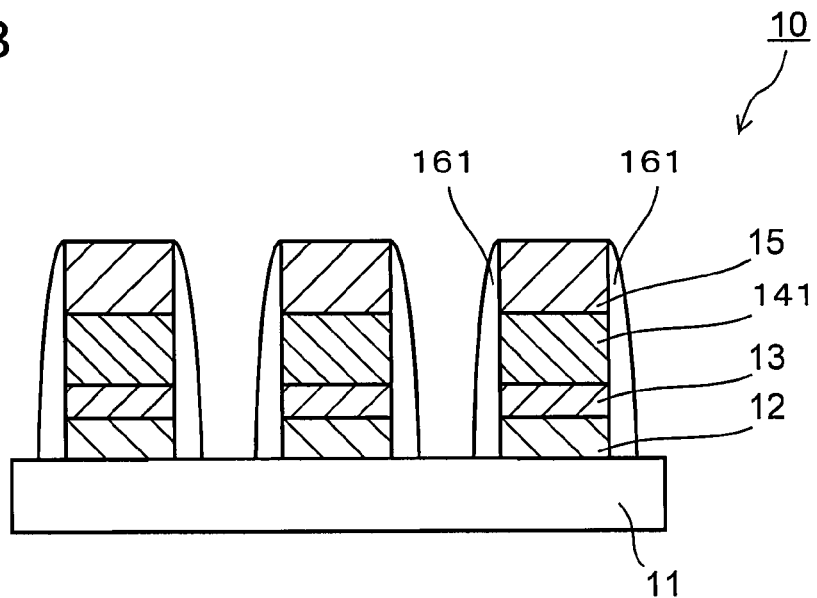
FIG. 8 is likewise a process view in the method for manufacturing the NAND type flash memory illustrated in FIG. 4.

As illustrated in FIG. 8, side walls 161 constituted of $SiO_2$ are formed on side faces of the stacked structures 18. The element isolation insulating layers $SiO_2$ can each be formed using a publicly known technique such as ALD (atomic layer deposition), CVD (chemical vapor deposition), coating, or RIE (reactive ion etching).

(3) Forming the Upper Insulating Layer

Figure 9:
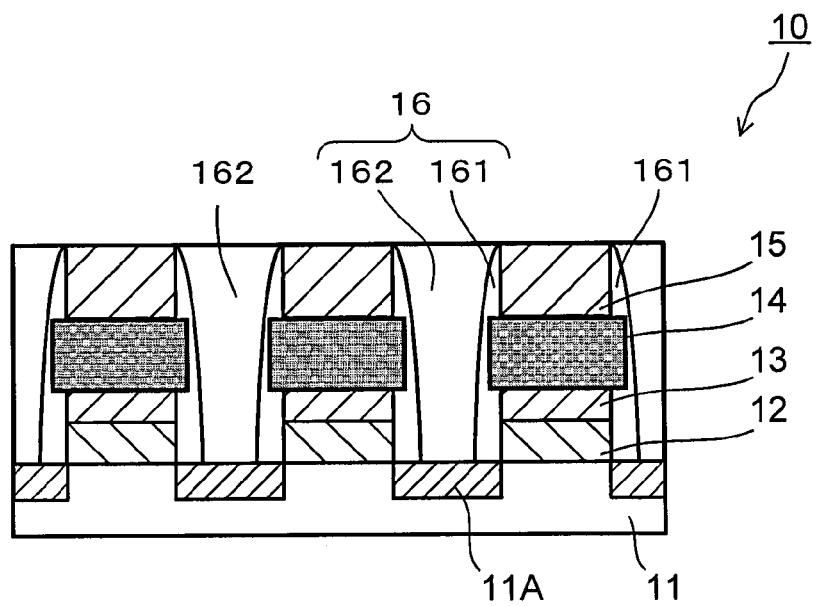
FIG. 9 is likewise a process view in the method for manufacturing the NAND type flash memory illustrated in FIG. 4.

Heating is performed to cause reaction between the reactive insulating layer 141 and the side walls 161, thereby forming the upper insulating layer 14 as illustrated in FIG. 9. That is, part of $SiO_2$ in the side walls 161 diffuses and moves in the reactive insulating layer 141, thereby changing the reactive insulating layer 141 to the upper insulating layer 14. By diffusion of $SiO_2$, the amount of $SiO_2$ in the upper insulating layer 14 becomes larger than the amount of $SiO_2$ in the reactive insulating layer 141. Further, the volume of the upper insulating layer 14 becomes larger than the volume of the reactive insulating layer 141 (the length of the upper insulating layer 14 becomes longer than the length of the reactive insulating layer 141).

As already described, before the reaction between the reactive insulating layer 141 and the side walls 161, the respective lengths $L_{charge}$, $L_{react}$, and $L_{gate}$ of the charge storage layer 13, the reactive insulating layer 141, and the control electrode 15 are substantially equal. Since the upper insulating layer 14 is formed by the reaction between the reactive insulating layer 141 and the side walls 161, the length $L_{top}$ of the upper insulating layer 14 increases from the length $L_{react}$ of the reactive insulating layer 141, and becomes larger than the respective lengths $L_{charge}$ and $L_{gate}$ of the charge storage layer 13 and the control electrode 15.

The length $L_{top}$ of the upper insulating layer 14 can be controlled by temperatures and times of heat treatment. For example, as the temperature is increased, diffusion of $SiO_2$ from the side walls 161 to the reactive insulating layer 141 becomes active, allowing the length $L_{top}$ of the upper insulating layer 14 to increase. That is, the length $L_{top}$ of the upper insulating layer 14 can be controlled by the temperatures of the heat treatment.

Here, since the reactive insulating layer 141 changes to the upper insulating layer 14 by diffusion of $SiO_2$ from the side walls 161, it is possible that transient non-uniformity occurs in density of $SiO_2$ in the reactive insulating layer 141. However, it is possible that the density of $SiO_2$ in the generated upper insulating layer 14 to be uniform when the heat treatment time is equal to or longer than a certain length.

In addition, the above-described heating after forming the side walls 161 can be implemented at an arbitrary timing after the side walls 161 or the element isolation insulating layer 16 is formed. In particular, in the case where the semiconductor device does not include the side walls 161, it is performed after forming a buried oxide film 162.

(4) Forming Impurity Doping Layers

Next, ions are implanted with the stacked structures 18 and the side walls 161 being a mask, and heating for activating impurities is applied, thereby forming the impurity doping layers 11A. For example, impurities can be doped under the condition of using phosphorous, acceleration voltage 40 keV, and dose amount $2 \times 10^{15}$ $cm^2$. The heating for activating impurities is implemented under the condition of, for example, 30 seconds at 900° C. in a nitrogen atmosphere. In addition, an impurity doping layer may be formed before the side walls 161 are formed. In this case, ions are implanted with the stacked structures 18 being a mask.

After forming the impurity doping layers 11A, the buried oxide film 162 is formed among the stacked structures 18. The buried oxide film can be formed using a publicly known technique such as ALD (atomic layer deposition), CVD (chemical vapor deposition), or coating. An insulating layer formed of the side walls 161 and the buried oxide film 162 becomes the element isolation insulating layer 16.

Through the above-described processes, the NAND type flash memory 10 as illustrated in FIG. 4 is obtained.

Other Embodiments

In the foregoing, the semiconductor device according to the embodiment of the present invention has been described in detail based on the specific example, but the invention is not limited to the specific example, and various variations and modifications may be made without departing from the scope of the present invention.

For example, the stacked structures may not necessarily be disposed on the Si substrate. For example, the stacked structures may be formed on a well formed on a Si substrate. Further, the stacked structures may be formed on a SiGe substrate, a Ge sub, a SiGeC substrate, or a well formed on one of these substrates. Moreover, the stacked structures may also be formed on a well formed on an SOI (silicon on insulator) substrate, a GOI (germanium on insulator) substrate, an SGOT (silicon-germanium on insulator) substrate on which a thin-film semiconductor on an insulating film is formed, or a well formed on one of these substrates.

Further, the structure in the above-described specific example has a flat channel. However, the present invention is also applicable to a semiconductor device structured to have a three-dimensional channel portion as represented by a FIN structure. Further, the arrangement of elements on the semiconductor device is not limited to be on a flat surface. The present invention is also applicable to a stacked structure and a vertical structure.

Further, the semiconductor device of NAND type is described in the above-described specific example. However, the present invention is applicable to a non-volatile semiconductor memory device of NOR type, AND type, or DINOR type, a NANO type flash memory combining a NOR type and a NAND type, and a 3Tr-NAND type having a structure in which one memory element is sandwiched by two selection transistors, and the like.

Furthermore, although a ternary system with metal M, Si, and O and a quaternary system with Al added thereto are described in the above-described specific example, the present invention is applicable to a system with an element further added thereto. The present invention is also applicable to one in which part of oxygen elements is replaced with N elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor region;
   a plurality of stacked structures each of which is disposed on the semiconductor region and has a tunnel insulating film, a charge storage layer, an upper insulating layer, and a control electrode stacked sequentially;
   an element isolation insulating layer disposed on side faces of the plurality of stacked structures; and
   a source-drain region disposed on the semiconductor region and among the plurality of stacked structures,
   wherein the element isolation insulating layer includes at least one of $SiO_2$, SiN, and SiON;
   wherein the upper insulating layer is an oxide containing Al, La, and Si;
   wherein a ratio $N_{Si}/N_{La}$ of the number $N_{Si}$ of Si to the number $N_{La}$ of La is equal to or lower than a ratio with which permittivity of the upper insulating layer matches that of $Al_2O_3$;
   wherein a ratio $N_{Al}/N_{La}$ of the number $N_{Al}$ of Al to the number $N_{La}$ of La is equal to or higher than 0.0625 and is equal to or lower than 96;
   wherein a ratio $N_{Si}/(N_{La}+N_{Al})$ of the number $N_{Si}$ of Si to the sum of the numbers $N_{La}$ and $N_{Al}$ of La and Al contained in the upper insulating layer is equal to or higher than 0.6; and
   wherein respective lengths $L_{charge}$, $L_{top}$, and $L_{gate}$ of the charge storage layer, the upper insulating layer, and the control electrode in a channel length direction satisfy the relation "$L_{charge} < L_{top}$ and $L_{gate} < L_{top}$".

2. The semiconductor device according to claim 1,
   wherein a ratio $N_{Si}/N_{La}$ of the number $N_{Si}$ of Si to the number $N_{La}$ of La is equal to or higher than a ratio at a $SiO_2$ solubility limit in an oxide of La.

3. The semiconductor device according to claim 1,
   wherein lengths $L_{charge}$, $L_{top}$, $L_{gate}$ in the channel length direction of the charge storage layer, the upper insulating layer, and the control electrode satisfy a relation "$L_{top} < L_{charge} \times (1+(\epsilon_k-10)/6.1 \times V_{Si}/V_{La})$ and $L_{top} < L_{gate} \times (1+(\epsilon_k-10)/6.1 \times V_{Si}/V_{La})$";
   wherein $\epsilon_k$ is relative permittivity of an oxide of La;
   wherein $V_{La}$ is a volume occupied by one mole of an oxide of La; and
   wherein $V_{Si}$ is a volume occupied by one mole of $SiO_2$.

4. The semiconductor device according to claim 3,
   wherein a ratio $N_{Si}/(N_{La}+N_{Al})$ of the number $N_{Si}$ of Si to the sum of the numbers $N_{La}$ and $N_{Al}$ of La and Al contained in the upper insulating layer is in a range in which relative permittivity of the upper insulating layer to vacuum is 12.4 or higher and less than 27.

* * * * *